United States Patent [19]

Inoue

[11] Patent Number: 5,777,568
[45] Date of Patent: Jul. 7, 1998

[54] ANALOG/DIGITAL AND DIGITAL/ANALOG CONVERTING APPARATUS

[75] Inventor: Shinichi Inoue, Chiba, Japan

[73] Assignee: Sony Corporation, Tokyo, Japan

[21] Appl. No.: 769,538

[22] Filed: Dec. 19, 1996

[30] Foreign Application Priority Data

Dec. 27, 1995 [JP] Japan ................................ 7-341498

[51] Int. Cl.$^6$ ........................................... H03M 1/00
[52] U.S. Cl. ................................... 341/138; 341/118
[58] Field of Search ................................ 341/110, 118, 341/120, 138

[56] References Cited

FOREIGN PATENT DOCUMENTS 8032382  2/1996  Japan ................. H03G 3/20

*Primary Examiner*—Jeffrey A. Gaffin
*Assistant Examiner*—Peguy Jean-Pierre
*Attorney, Agent, or Firm*—Jay H. Maioli

[57] ABSTRACT

An analog/digital and digital/analog converting apparatus includes an analog/digital converter circuit for converting an input analog signal into a digital signal, a digital/analog converter circuit for converting the digital signal converted by the analog/digital converter circuit into an analog signal to obtain an output signal, a level-control variable resistor for controlling a level of a signal to be supplied to the analog/digital converter circuit, and an adjustment circuit for changing a pulse height value or a current value of the output signal so that the levels of the input signal and the output signal are the same by applying a predetermined DC voltage based on the change of the level-control variable resistor and for supplying a control signal used for controlling the level of the output signal to the digital/analog converter circuit.

6 Claims, 5 Drawing Sheets

1

ANALOG/DIGITAL AND DIGITAL/ANALOG CONVERTING APPARATUS

BACKGROUND OF THE INVENTION

1. Field of the Invention

The present invention relates to an analog/digital and digital/analog converting apparatus used in a technical field of an audio reproducing apparatus, for example.

2. Description of the Prior Art

There has been available an apparatus which converts a sound of a musical instrument or a voice picked up by a microphone in a concert hall or the like into an electric signal and subjects this electric signal to sound effects and then emanates the sound or the voice subjected to the sound effects from speakers. Such apparatus temporarily converts an input electric signal into a digital signal and then subjects the digital signal to a digital processing, thereafter converting the digital signal into an analog signal again for outputting the analog signal.

FIGS. 1, 2 and 3 are diagrams showing arrangements of analog/digital and digital/analog converting apparatus according to the prior art. An arrangement of the analog/digital and digital analog converting apparatus shown in FIG. 1 will be described initially. The analog/digital and digital/analog converting apparatus has an input terminal 101 to which an analog audio signal is input, an A/D converter circuit 103 for converting the analog audio signal into a digital audio signal, a digital-signal processing circuit 104 for applying the digital audio signal with the sound effects, a D/A converter circuit 105 for converting the digital signal applied with the sound effects into an analog audio signal, two variable resistors 102, 106 for correlatively operating so as to respectively adjust signal levels of the input audio signal and an output audio signal, and an output terminal 107 supplied with the output signal.

In this case, the first variable resistor 102 is provided between the input terminal 101 and the A/D converter circuit 103, and the second variable resistor 106 is provided between the D/A converter circuit 105 and the output terminal 107. As shown by a dot line in FIG. 1, the variable resistors 102, 106 correlatively operate to change their resistance values. At this time, if the resistance value of the one variable resistor 102 is set larger, then the resistance value of the other variable resistor 106 is set smaller, which cancels their voltage dividing operations. The digital-signal processing circuit 104 is an effector for adding the digital audio signal with a reverberation sound by using a delay and a memory or is a mixer for mixing the digital audio signal with other signals.

An operation of the analog/digital and digital/analog converting apparatus thus arranged shown in FIG. 1 will hereinafter be described. When the analog audio signal is input through the input terminal 101 to the first variable resistor 102, the analog audio signal is adjusted by the first variable resistor 102 so as to have a predetermined level, and then supplied to the A/D converter circuit 103. The A/D converter circuit 103 converts the analog audio signal into the digital audio signal and supplies the digital audio signal to the digital-signal processing circuit 104. The digital-signal processing circuit 104 applies to the digital audio signal the sound effects such as an effect, a mixing or the like, and then supplies the processed digital audio signal to the D/A converter circuit 105. The D/A converter circuit 105 converts the digital audio signal applied with the sound effects into an analog audio signal and then supplies the analog signal to the other variable resistor 106. The supplied analog audio signal is adjusted by the other variable resistor 106 so as to have the same level as that of the input analog audio signal, and then supplied to the output terminal 107.

An arrangement of the analog/digital and digital/analog converting apparatus shown in FIG. 2 will be described. The analog/digital and digital/analog converting apparatus has an input terminal 101 to which an analog audio signal is input, an A/D converter circuit 103 for converting the analog audio signal into a digital audio signal, a digital-signal processing circuit 104 for applying the sound effects with the digital audio signal, a D/A converter circuit 105 for converting the processed digital audio signal into an analog audio signal, two variable resistors 102, 106 for correlatively operating to adjust respective signal levels of the input audio signal and an output audio signal, and an output terminal 107 supplied with the output audio signal. The analog/digital and digital/analog converting apparatus shown in FIG. 2 is different from that shown in FIG. 1 in that changeover taps 108, 109 are respectively provided in the variable resistors 102, 106.

An operation of the analog/digital and digital/analog converting apparatus shown in FIG. 2 having the above-mentioned arrangement will hereinafter be described. When an analog audio signal is input through the input terminal 101 to the first variable resistor 102, the input analog audio signal is adjusted depending upon a position of the changeover tap 108 of the first variable resistor 102 so as to have a predetermined level, and then supplied to the A/D converter circuit 103. The A/D converter circuit 103 converts the analog audio signal into a digital audio signal and applies to the digital audio signal the digital-signal processing circuit 104. The digital-signal processing circuit 104 subjects the digital audio signal to a sound effect such as an effect, mixing or the like and supplies the processed digital audio signal to the D/A converter circuit 105. The D/A converter circuit 105 converts the processed digital audio signal into an analog audio signal and supplies the analog audio signal to the second variable resistor 106. The supplied analog audio signal is adjusted depending upon a position of the changeover tap 109 of the other variable resistor 109 so as to have the same level as that of the input analog audio signal, thereafter being supplied to the output terminal 107.

An arrangement of the analog/digital and digital/analog converting apparatus shown in FIG. 3, which is disclosed in Japanese patent publication No. 45006/1992, will be described. The analog/digital and digital/analog converting apparatus has an input terminal 101 to which an analog audio signal is input, an A/D converter circuit 103 for converting the analog audio signal into a digital audio signal, a digital-signal processing circuit 104 for applying sound effects such as an effect, a mixing or the like with the digital audio signal, a D/A converter circuit 105 for converting the digital audio signal applied with the sound effect into an analog audio signal, a reference voltage source 110 for applying a predetermined DC voltage to the analog audio signal, two variable resistors 102, 106 for correlatively operating to adjust respective signal levels of the input analog audio signal and a reference signal, an A/D converting circuit 111 for converting the analog reference signal into a digital reference signal, a microcomputer 112 for generating a control signal based on the digital reference signal, a D/A converter circuit 113 for converting the digital control signal into an analog control signal, a voltage-controlled amplifier (VCA) for amplifying a signal level of the analog audio signal based on the analog control signal, and an output terminal 107 supplied with an output signal.

The analog/digital and digital/analog converting apparatus shown in FIG. 3 is different from that shown in FIG. 1 in that the signal levels of the input audio signal and the reference signal are adjusted by the variable resistors 102, 106, the microcomputer 112 generates the control signal based on the reference signal, and the VCA 114 amplifies the signal level of the analog audio signal based on the control signal.

An operation of the analog/digital and digital/analog converting apparatus having the above arrangement shown in FIG. 3 will hereinafter be described. When the analog audio signal is input through the input terminal 101 to the first variable resistor 102, the analog audio signal is adjusted by the first variable resistor 102 so as to have a predetermined level, and then supplied to the A/D converter circuit 103. The A/D converter circuit 103 converts the analog audio signal into the digital audio signal and supplies the digital audio signal to the digital-signal processing circuit 104. The digital-signal processing circuit 104 applies the sound effects such as an effect, a mixing or the like with the digital audio signal, and then supplies the processed digital audio signal to the D/A converter circuit 105. The D/A converter circuit 105 converts the digital audio signal applied with the sound effects into an analog audio signal and then supplies the analog audio signal to the VCA 114.

The reference signal based on an applied reference voltage from reference voltage source 110 is adjusted by the other variable resistor 106 so as to have the same signal level as that of the input analog audio signal and then supplied to the A/D converter circuit 111. The A/D converter circuit 111 converts the supplied reference signal into the digital reference signal and supplies the digital reference signal to the microcomputer 112. The microcomputer 112 generates the digital control signal based on the digital reference signal and supplies the digital control signal to the D/A converter circuit 113. The D/A converter circuit 113 converts the digital control signal into an analog control signal and supplies the analog control signal to a control terminal (not shown) of the VCA 114. The VCA 114 amplifies a signal level of the analog audio signal supplied from the D/A converter circuit 105 based on the analog control signal so that the signal level of the analog audio signal is equal to that of the input analog audio signal. Then, the VCA 114 supplies the amplified analog audio signal to the output terminal 107.

However, the analog/digital and digital/analog converting apparatus shown in FIG. 1 has the following disadvantage. Specifically, while the two variable resistors 102, 106 correlatively operate to cancel the voltage dividing operations on both of the input and output signal sides, when the characteristics of the two variable resistors 102, 106 are set inversely proportional to each other, an ideal characteristic allowing the respective characteristics to cancel each other is not obtained, which leads to insufficient cancellation of the characteristics of the variable resistors 102, 106 and hence hardly makes the level of the signal constant.

Since the analog/digital and digital/analog converting apparatus shown in FIG. 2 has the changeover taps 108, 109 respectively provided in the two variable resistors 102, 106, its circuit scale inevitably becomes large.

Since the analog/digital and digital/analog converting apparatus shown in FIG. 3 provides an insufficient operation characteristic of the VCA 114, it is difficult to set the level of the output signal constant.

SUMMARY OF THE INVENTION

It is a first object of the present invention to provide an analog/digital and digital/analog converting apparatus in which an analog signal forcing an A/D converter or the like to process a signal in a saturation range is adjusted on an input side of the A/D converter so as to have a predetermined level and a D/A converter adjusts a signal level, thereby levels of input and output analog signals being set substantially equal to each other.

It is a second object of the present invention to provide an analog/digital and digital/analog converting apparatus in which an analog signal forcing a digital-signal processing circuit to process a signal in a saturation range is adjusted on an input side of the A/D converter so as to have a predetermined level and a D/A converter adjusts a signal level, thereby levels of input and output analog signals being set substantially equal to each other.

It is a third object of the present invention to provide an analog/digital and digital/analog converting apparatus in which an analog signal forcing an A/D converter and the digital-signal processing circuit to process a signal in its saturation range is adjusted on an input side of the A/D converter so as to have a predetermined level and a D/A converter adjusts a signal level, thereby levels of input and output analog signals are set substantially equal to each other thereby its circuit arrangement is simplified.

According to a first aspect of the present invention, an analog/digital and digital/analog converting apparatus includes an analog/digital converter circuit for converting an input analog signal into a digital signal, a digital/analog converter circuit for converting the digital signal converted by the analog/digital converter circuit into an analog signal to obtain an output signal, a level-control variable resistor for controlling a level of a signal to be supplied to the analog/digital converter circuit, and an adjustment circuit for changing a pulse height value or a current value of the output signal so that levels of the input signal and the output signal should be the same by applying a predetermined DC voltage based on change of the level-control variable resistor and for supplying a control signal used for controlling the level of the output signal to the digital/analog converter circuit.

According to a second aspect of the present invention, an analog/digital and digital/analog converting apparatus includes an analog/digital converter circuit for converting an input analog signal into a digital signal, a 1-bit digital/analog converter circuit for converting the digital signal converted by the analog/digital converter circuit into an analog signal to obtain an output signal, a level-control variable resistor for controlling a level of a signal to be supplied to the analog/digital converter circuit, and an adjustment circuit for changing a pulse height value or a current value of the output signal so that levels of the input signal and the output signal are the same by applying a predetermined DC voltage based on change of the level-control variable resistor and for supplying a control signal used for controlling the level of the output signal to the 1-bit digital/analog converter circuit.

DESCRIPTION OF THE PREFERRED EMBODIMENTS

Figure 1:
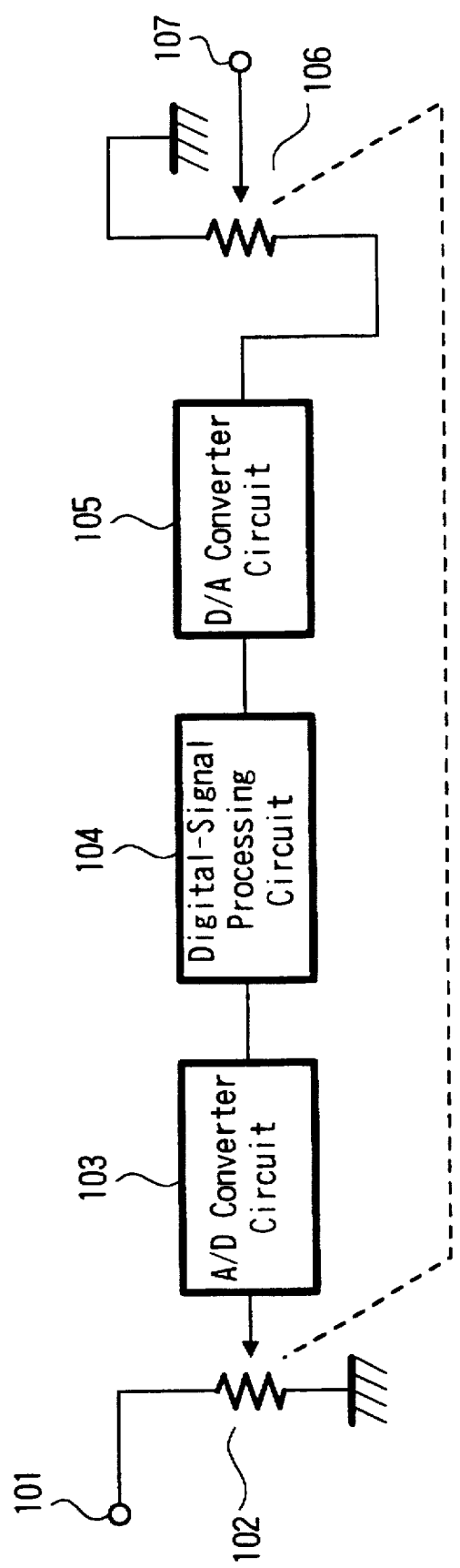
FIG. 1 is a block diagram showing an arrangement of a conventional analog/digital and digital/analog converting apparatus.
Figure 2:
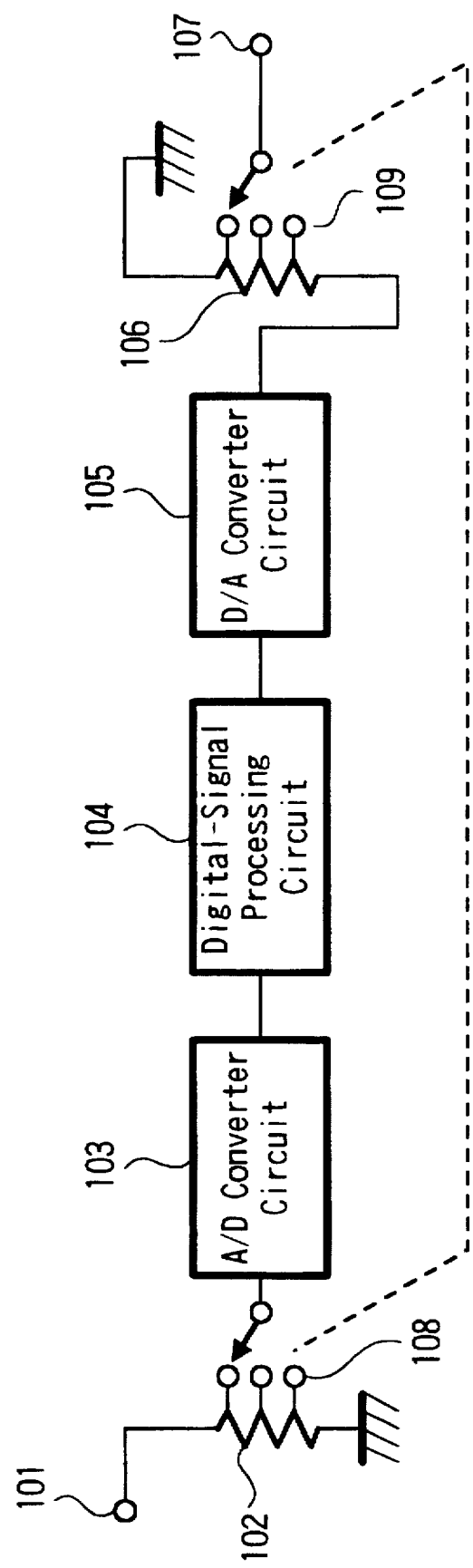
FIG. 2 is a block diagram showing an arrangement of another conventional analog/digital and digital/analog converting apparatus.

An analog/digital and digital/analog converting apparatus according to a first embodiment of the present invention will hereinafter be described with reference to FIG. 4.

An arrangement of the analog/digital and digital/analog converting apparatus shown in FIG. 4 according to this embodiment will be described. This analog/digital and digital/analog converting apparatus according to this embodiment has an input terminal 1 to which an analog audio signal is input, an A/D converter circuit 3 for converting the analog audio signal into a digital audio signal, a digital-signal processing circuit 4 for applying to the digital audio signal sound effects, a 1-bit D/A converter circuit 5 for converting the processed digital audio signal into an analog audio signal, a reference voltage source 8 for applying a predetermined DC voltage, two variable resistors 2, 9 for correlatively operating to adjust respective signal levels of the input analog audio signal and an analog reference signal, an A/D converter circuit 10 for converting the analog reference signal into a digital reference signal, a microcomputer 11 for generating a digital control signal based on the digital reference signal, a D/A converter circuit 12 for converting the digital control signal into an analog control signal and supplying the analog control signal to the 1-bit D/A converter circuit 5, a low-pass filter (LPF) 14 for converting a pulse signal output from the 1-bit D/A converter circuit 5 into an analog signal, and an output terminal 15 supplied with an output signal from the LPF 14.

The 1-bit D/A converter circuit 5 has a switch 6 and a variable current source 7. The switch 6 controls the number and a width of the output pulses, and the variable current source 7 controls a pulse height value of the output pulse.

Figure 3:
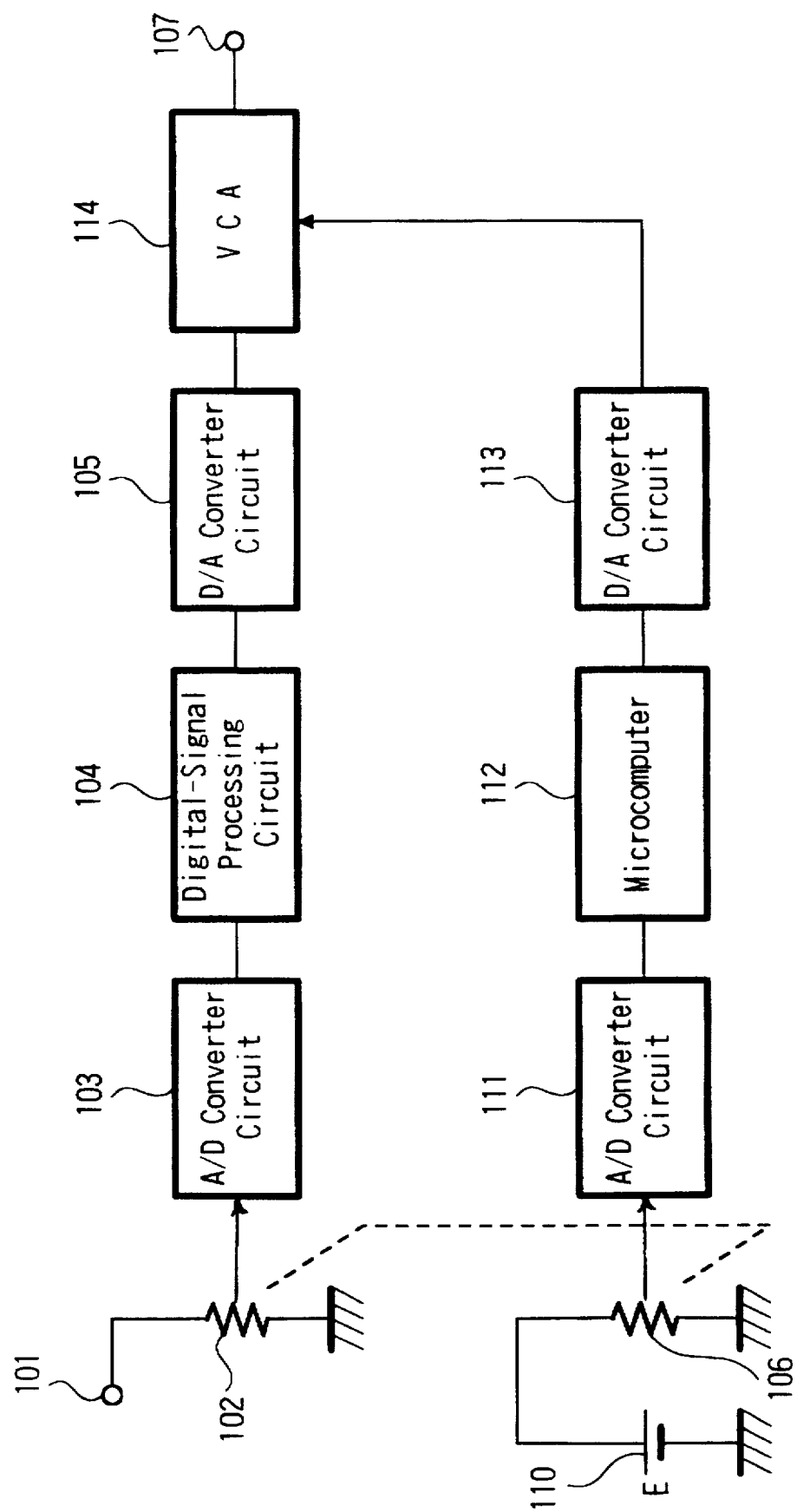
FIG. 3 is a block diagram showing an arrangement of a further conventional analog/digital and digital/analog converting apparatus.
Figure 4:
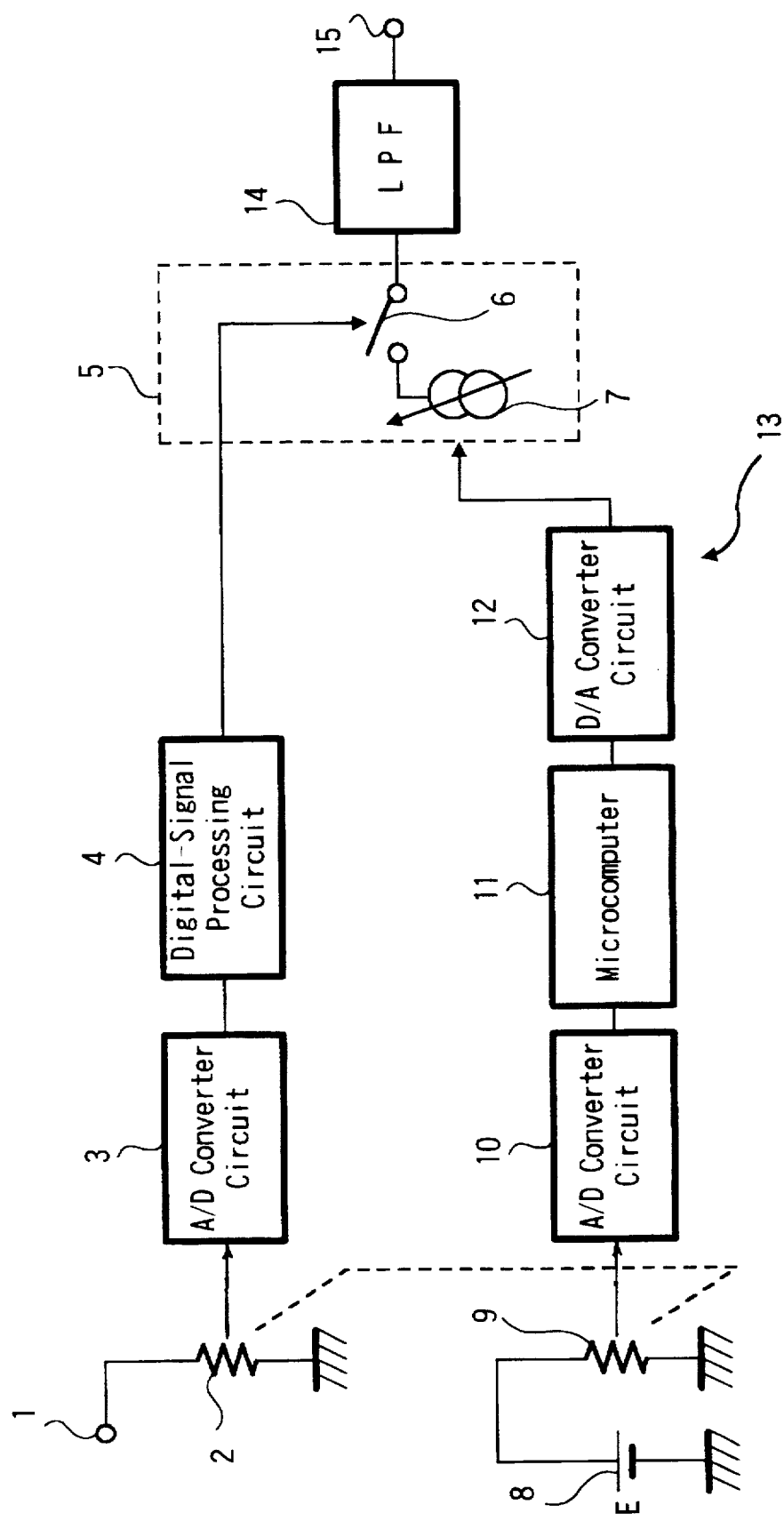
FIG. 4 is a block diagram showing an arrangement of an analog/digital and digital/analog converting apparatus according to an embodiment of the present invention.

The analog/digital and digital/analog converting apparatus shown in FIG. 4 according to this embodiment is different from the analog/digital and digital/analog converting apparatus shown in FIG. 3 in that the 1-bit D/A converter circuit 5 and the LPF 14 are provided instead of the D/A converter circuit 105 and the VCA 114 shown in FIG. 3. As shown in FIG. 4, an allowance adjusting circuit 13 is formed by the reference voltage source 8, the second variable resistor 9, the A/D converter circuit 10, the microcomputer 11 and the D/A converter circuit 12.

An operation of the analog/digital and digital/analog converting apparatus having the above arrangement shown in FIG. 4 will hereinafter be described. When the analog audio signal is input through the input terminal 1 to the first variable resistor 2, the analog audio signal is adjusted by the one variable resistor 2 so as to have a predetermined level and then supplied to the A/D converter circuit 3. The A/D converter circuit 3 converts the analog audio signal into the digital audio signal and supplies the digital audio signal to the digital-signal processing circuit 4. The digital-signal processing circuit 4 applies to the supplied digital audio signal the sound effects such as an effect, a mixing or the like and supplies the processed digital audio signal to the 1-bit D/A converter circuit 5. The 1-bit D/A converter circuit 5 converts the digital audio signal applied with the sound effects into an analog audio signal.

The 1-bit D/A converter circuit 5 generates a pulse signal with its variable pulse number or variable pulse width by controlling the switch 6, and supplies the output pulse signal with the variable number or variable pulse width to the LPF 14 as a converted output signal. The LPF 14 averages the output pulse signal to obtain the analog audio signal. In this case, a pulse waveform of the pulse signal output from the 1-bit D/A converter circuit 5 has one of two levels, i.e., a high level or a low level. Modulation for changing a pulse waveform in response to an input digital data is called pulse number modulation (PNM), and modulation for changing a width of a pulse waveform in response to the input digital data is called pulse width modulation (PWM). Employment of the 1-bit D/A converter circuit 5 employing such modulation systems leads to minimum distortion of a signal caused upon the D/A conversion. Therefore, it is possible to convert the digital audio signal into a satisfactory analog audio signal having no distortion.

The reference signal based on the reference voltage from the reference voltage source 8 is adjusted by the other variable resistor 9 so as to have the same signal level as that of the input analog audio signal and then supplied to the A/D converter circuit 10. The A/D converter circuit 10 converts the supplied analog reference signal into the digital reference signal and supplies the digital reference signal to the microcomputer 11. The microcomputer 11 generates the digital control signal based on the supplied digital reference signal. When generating the digital control signal, the microcomputer 11 carries out calculations so that the signal level of the output audio signal is the same as that of the input analog audio signal. The microcomputer 11 supplies the digital control signal to the D/A converter circuit 12. The D/A converter circuit 12 converts the digital control signal into an analog control signal and supplies the analog control signal to the control terminal of the 1-bit D/A converter circuit 5. The variable current source 7 of the 1-bit D/A converter circuit 5 changes the pulse height value or level of the output audio signal based on the analog control audio signal.

The analog audio signal is processed as described above so as to have the same signal level as that of the input analog audio signal is supplied to the LPF 14. The LPF 14 averages the supplied analog audio signal and then supplies it to the output terminal 15.

Specifically, the one variable resistor 2 controls the input analog audio signal to have an amplitude set by the allowance adjustment for preventing a signal level from falling in a saturation range. The other variable resistor 9 for operating in a correlative relation with the one variable resistor 2 divides the reference voltage from the reference voltage source 8 to thereby set a voltage-division attenuation amount. Since a digital signal having this voltage-division attenuation amount cancels a difference between the amplitudes of the input and output analog audio signals produced by the allowance adjustment, the variable current source 7 for determining the pulse height value of the output pulse signal is changed in order to increase the output signal of the 1-bit D/A converter circuit 5 by the changed amount equal to the voltage-division attenuation amount. Thus, the analog/digital and digital/analog converting apparatus according to this embodiment adjusts the allowance used for preventing a signal level from falling within the saturation range, by adjusting the signal levels of both the input and output analog audio signals.

According to this embodiment, since the analog/digital and digital/analog converting apparatus carries out the calculation so that the signal levels of the input and output analog audio signals are the same by setting the characteristics of the variable resistors 2, 9 in the same direction and hence changing the pulse height value level of the output audio signal, it is possible to reduce the difference between the input and output analog audio signals. Since the analog/digital and digital/analog converting apparatus employs the 1-bit D/A converter circuit 5 instead of the D/A converter circuit of plural bits, it is possible to reduce a scale of an analog circuit. Moreover, the analog/digital and digital/analog converting apparatus can adjust the allowance used for preventing the signal level from falling within the saturation range without employing the VCA and hence highly efficiently converting an analog signal into a digital signal and vice versa.

While in the above embodiment the pulse height value of the pulse signal output from the 1-bit D/A converter circuit 5 is changed, a current value level of a constant current source or a reference voltage of a constant current source may be changed as will be described in a second embodiment later on.

Figure 5:
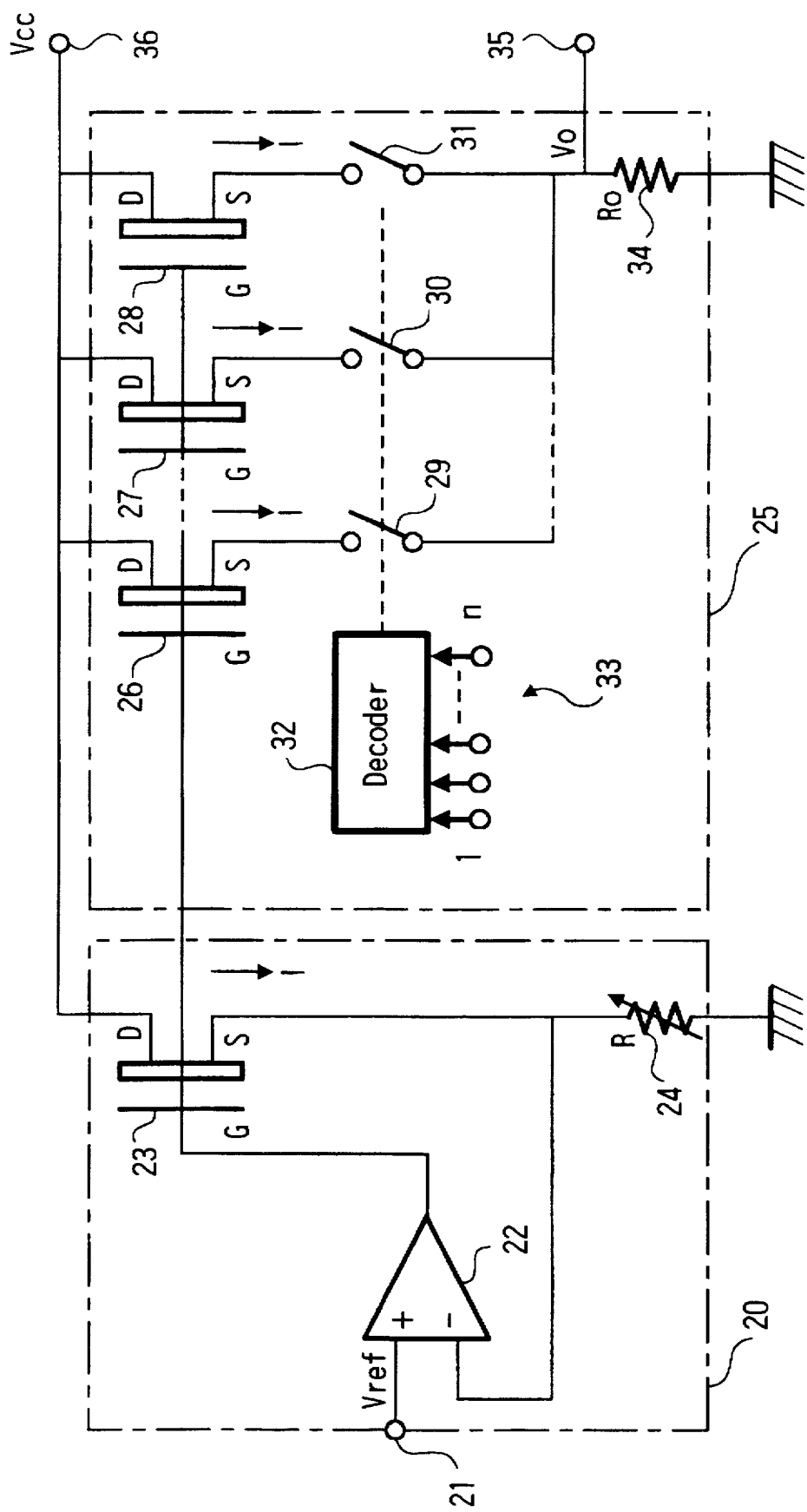
FIG. 5 is a diagram showing a circuit arrangement of a 1-bit D/A converter circuit according to another embodiment of the present invention.

An analog/digital and digital/analog converting apparatus according to the second embodiment will hereinafter be described with reference to FIG. 5. The second embodiment shows a D/A converter circuit previously filed by the same assignee and disclosed in U.S. Pat. No. 5,218,364 and also disclosed in Japanese laid-open patent publication No. 070215/1992.

An arrangement of the 1-bit D/A converter circuit according to the second embodiment will be described. As shown in FIG. 5, the 1-bit D/A converter circuit has a fundamental circuit 20 and a D/A converter unit 25. The bias circuit 20 has an input terminal 21, a fundamental FET 23, a negative feedback amplifier 22, and a variable resistor 24. The D/A converter unit 25 has a plurality of FETs 26, 27, 28, a plurality of switches 29, 30, 31, a decoder 32 having digital input terminals 33, an output resistor 34, a power-source voltage terminal 36, and an output terminal 35.

A drain D of the fundamental FET 23 of the fundamental circuit 20 is connected to the power-source voltage terminal 36. A source S of the fundamental FET 23 is connected to one end of the variable resistor 24. The other end of the variable resistor 24 is grounded. A non-inverting input terminal (+) of the negative feedback amplifier 22 is connected to the input terminal 21. An inverting input terminal (−) of the negative feedback amplifier 22 is connected to the source S of the fundamental FET 23. An output terminal of the negative feedback amplifier 22 is connected to the gate G of the fundamental FET 23.

In the D/A converter unit 25, drains D of the plurality of fundamental FETs 26, 27, 28 as constant-current sources are connected to the power-supply voltage terminal 36. Gates G thereof are commonly connected to the gate G of the fundamental FET 23 of the bias circuit 20. Sources S of the plurality of the FETs 26, 27, 28 are respectively connected to first ends of the plurality of switches 29, 30, 31. The other ends of the plurality of switches 29, 30, 31 are commonly connected to the output terminal 35 and also to a first end of the output resistor 34. The other end of the output resistor 34 is grounded. The decoder 32 for controlling the switches 29, 30, 31 is connected to control terminals (not shown) of the plurality of switches 29, 30, 31. The decoder 32 has the digital input terminals 33 to which the digital signals can be input.

The 1-bit D/A converter circuit according to the second embodiment having the above arrangement is operated as follows. When an input voltage $V_{ref}$ is supplied to the input terminal 21 of the fundamental circuit 20, a current I satisfying $I=V_{ref}/R[A]$ flows through the source S of the fundamental FET 23. In the D/A converter unit 25, the current I satisfying $I=V_{ref}/R[A]$ and similar to that flowing through the fundamental circuit 23 flows through the respective sources S of the plurality of FETs 26, 27, 28 as the constant-current sources. At this time, the decoder 32 controls the switches 29, 30, 31 in their on- or off-states, based on a 1-bit digital input signal supplied to the digital input terminal 33 thereof. An output current is output to the output terminal 35 in response to the switch which is set in its on-state. Therefore, it is possible to change a current value of the output signal by controlling the digital input signal or the input voltage $V_{ref}$.

If the number of the digital input terminals 33 of the decoder 32 of the D/A converter unit 25 is n and a resistance value of the output resistor 34 is $R_0$, then a resistance value of the variable resistor 24 of the fundamental circuit 20 is adjusted so as to satisfy $R=(2^n-1)\cdot R_0$, which allows a level of an output voltage to be equal to that of an input voltage. Therefore, it is possible to change a voltage level of an output signal by changing the resistance value of the variable resistor 24 of the fundamental circuit 20.

According to the second embodiment, since the analog/digital and digital/analog converting apparatus carries out the calculation so that the signal levels of the input and output analog audio signals are the same by setting the characteristics of the variable resistors 2, 9 in the same direction and hence changes the current value level of the output audio signal, it is possible to reduce the difference between the input and output analog audio signals. Since the analog/digital and digital/analog converting apparatus according to the second embodiment employs the 1-bit D/A converter circuit 5 instead of a D/A converter circuit of plural bits, it is possible to reduce a scale of an analog circuit. Moreover, the analog/digital and digital/analog converting apparatus according to the second embodiment can adjust the allowance used for preventing the signal level from falling within the saturation range without employing the VCA and hence highly efficiently convert an analog signal into a digital signal and vice versa.

The analog/digital and digital/analog converting apparatus according to the first embodiment of the present invention includes the A/D converter circuit 3 for converting the input analog audio signal into the digital audio signal, the 1-bit D/A converter circuit 5 for converting the digital audio signal obtained by the A/D converter circuit 3 into the analog audio signal again to obtain the output audio signal, the level-control variable resistor 2 for controlling the level of the input analog audio signal to be supplied to the A/D converter circuit 3, and the allowance adjustment circuit 13 for carrying out calculation so that the levels of the input and output audio signals are the same to change the pulse height level of the output audio signal by applying the DC voltage based on the reference voltage changed in correlation with the level-control variable resistor 2 and for supplying the control signal used for controlling the level of the output signal to the 1-bit D/A converter circuit 5. In the first embodiment, the allowance adjustment for preventing the signal level from falling in the saturation range of the A/D converter circuit 3 and the 1-bit D/A converter circuit 5 is carried out by adjusting the signal levels of the input and output audio signals correlatively. Therefore, since the analog/digital and digital/analog converting apparatus according to the first embodiment carries out the calculation so that the signal levels of the input and output analog audio signals are the same and hence changes the pulse height value level of the output audio signal, it is possible to reduce the difference between the input and output analog audio signals. It is possible to reduce the scale of an analog circuit.

Moreover, the analog/digital and digital/analog converting apparatus according to the first embodiment can adjust the allowance used for preventing the signal level from falling within the saturation range and hence highly efficiently converting an analog signal into a digital signal and vice versa.

The analog/digital and digital/analog converting apparatus according to the second embodiment of the present invention includes the A/D converter circuit 3 for converting the input analog audio signal into the digital audio signal, the 1-bit D/A converter circuit 5 for converting the digital audio signal obtained by the A/D converter circuit 3 into the analog audio signal again to obtain the output audio signal, the level-control variable resistor 2 for controlling the level of the input analog audio signal to be supplied to the A/D converter circuit 3, and the allowance adjustment circuit 13 for carrying out calculation so that the levels of the input and output audio signals should be the same by applying a predetermined DC voltage based on the reference voltage changed in a correlative relation with the level control variable resistor 2 to change the current value level of the output audio signal and for supplying the control signal used for controlling the level of the output signal to the 1-bit D/A converter circuit 5. In the second embodiment, the allowance adjustment for preventing the signal level from falling in the saturation range of the A/D converter circuit 3 and the 1-bit D/A converter circuit 5 is carried out by adjusting the signal levels of the input and output audio signals correlatively. Therefore, since the analog/digital and digital/analog converting apparatus according to the second embodiment carries out the calculation so that the signal levels of the input and output analog audio signals are the same and hence changes the current value level of the output audio signal, it is possible to reduce the difference between the input and output analog audio signals. It is possible to reduce a scale of an analog circuit. Moreover, the analog/digital and digital/analog converting apparatus according to the second embodiment can adjust the allowance used for preventing the signal level highly from falling within the saturation range and hence efficiently converting an analog signal into a digital signal and vice versa.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. An analog/digital and digital/analog converting apparatus comprising:

an analog/digital converter circuit for converting an input analog signal into a digital signal;

a 1-bit digital/analog converter circuit for converting said digital signal converted by said analog/digital converter circuit into an analog signal to produce an output signal;

a level-control variable resistor for controlling a level of said input analog signal supplied to said analog/digital converter circuit; and an adjustment circuit for changing a pulse height value of said output signal so that respective levels of said input analog signal and said output signal are the same by applying a predetermined constant voltage based on a change of said level-control variable resistor and by supplying a control signal for controlling said level of said output signal to said 1-bit digital/analog converter circuit.

2. The analog/digital and digital/analog converting apparatus according to claim 1, wherein said level-control variable resistor and said output signal from said 1-bit digital/analog converter circuit are adjusted correlatively.

3. The analog/digital and digital/analog converting apparatus according to claim 1, wherein said input analog signal is an audio signal.

4. An analog/digital and digital/analog converting apparatus comprising:

an analog/digital converter circuit for converting an input analog signal into a digital signal;

a 1-bit digital/analog converter circuit for converting said digital signal converted by said analog/digital converter circuit into an analog signal to produce an output signal;

a level-control variable resistor for controlling a level of said input analog signal supplied to said analog/digital converter circuit; and an adjustment circuit for changing a current value of said output signal so that respective levels of said input analog signal and said output signal are the same by applying a predetermined constant voltage based on a change of said level-control variable resistor and by supplying a control signal for controlling said level of said output signal to said 1-bit digital/analog converter circuit.

5. The analog/digital and digital/analog converting apparatus according to claim 4, wherein said level-control variable resistor and said output signal from said 1-bit digital/analog converter circuit are adjusted correlatively.

6. The analog/digital and digital/analog converting apparatus according to claim 4, wherein said input analog signal is an audio signal.

* * * * *